United States Patent [19]
Niiyama et al.

[11] Patent Number: 6,020,107
[45] Date of Patent: Feb. 1, 2000

[54] PATTERN FORMING METHOD THROUGH COMBINED ELECTRON BEAM AND LIGHT EXPOSURE UTILIZING MULTIPLE HEAT STEPS

[75] Inventors: Hiromi Niiyama, Yokohama; Shinji Sato, Kawasaki; Shunko Magoshi, Yokohama, all of Japan

[73] Assignee: Kabushiki Kaisha Toshiba, Kawasaki, Japan

[21] Appl. No.: 09/159,644

[22] Filed: Sep. 24, 1998

[30] Foreign Application Priority Data

Sep. 25, 1997 [JP] Japan ..................................... 9-259890
Jul. 10, 1998 [JP] Japan ..................................... 10-196074

[51] Int. Cl.[7] ................................. G03F 7/38; G03C 5/00
[52] U.S. Cl. ........................... 430/296; 430/328; 430/330
[58] Field of Search .................................... 430/296, 328, 430/330

[56] References Cited

U.S. PATENT DOCUMENTS 5,104,772   4/1992   Kobayashi et al. ...................... 430/296
5,789,140   8/1998   Chou et al. .............................. 430/296

OTHER PUBLICATIONS

R. Jonckheere et al., "Electron Beam / DUV Intra–Level Mix–And–Match Lithography for Random Logic 0.25μm CMOS", Microelectronic Engineering, 27:231–234 (1995).

F. Benistant et al., "A heavy Ion Implanted Pocket 0.10 μm n–Type Metal–Oxide–Semiconductor Field Effect Transistor With Hybrid Lithography (Electron–Beam/Deep Ultraviolet) and Specific Gate Passivation Process", J. Vac. Sci. Technol. B, 14(6):4051–4054 (1996).

*Primary Examiner*—Christopher G. Young
*Attorney, Agent, or Firm*—Finnegan, Henderson, Farabow, Garrett & Dunner, L.L.P.

[57] ABSTRACT

A rough pattern is formed on a chemically amplified resist by light exposing, and a fine pattern is formed by EB exposing. The resist is heated not only after EB exposing but also after light exposing. After this, the resist on which the rough and the fine patterns are formed is developed. As a result of this, diffusion or deactivation of an acid can be suppressed, and dimensional errors can be reduced.

19 Claims, 12 Drawing Sheets

INTERVAL BETWEEN LIGHT EXPOSING AND
PEB (HEATING); ZERO TIME (REF.)

F I G. 5A

INTERVAL BETWEEN LIGHT EXPOSING AND
PEB (HEATING); THREE HOURS

F I G. 5B

PEB TIME AFTER LIGHT EXPOSING ;
RECOMMENDED TIME X 100%
PEB TIME AFTER EB EXPOSING ;
RECOMMENDED TIME X 100%

F I G. 6A

PEB TIME AFTER LIGHT EXPOSING ;
RECOMMENDED TIME X 25%
PEB TIME AFTER EB EXPOSING ;
RECOMMENDED TIME X 75%

PATTERN FORMING METHOD THROUGH COMBINED ELECTRON BEAM AND LIGHT EXPOSURE UTILIZING MULTIPLE HEAT STEPS

BACKGROUND OF THE INVENTION

The present invention relates to a pattern forming method of forming a pattern on a resist using light exposing and electron beam (EB) exposing.

Photolithography has advantages such as simple processes and low cost and therefore is popularly used in the manufacture of semiconductor devices. Recent development of a shorter-wavelength light source (KrF excimer laser source) has made manufacture of devices with 0.25 $\mu$m geometries or less possible.

To achieve further shrinkage in device geometries, an ArF excimer laser source with an ultrashort wavelength and a phase shift mask (Levenson type etc.) have been examined. These are expected as mass-production lithography tools corresponding to the 0.15-$\mu$m rule. However, putting these tools into practical use poses a lot of problems and still requires a long time. Putting the tools into practical use may delay and may not reach the market-required level for some time.

Electron beam lithography is the first candidate of post-photolithography techniques. In electron beam lithography, an electron beam is focused and scanned on a resist, thereby forming a pattern on the resist. Electron beam lithography has reportedly achieved micropatterning on the order of 0.01 $\mu$m.

Electron beam lithography, however, has a problem of low throughput. That is, the number of wafers processed per hour is small. In electron beam lithography, a pattern is formed on a resist by two-dimensionally scanning the resist with a thin electron beam. For this reason, the throughput becomes lower than that of photolithography wherein a pattern is fully transferred.

To increase the throughput, a cell projection scheme for repeatedly forming the same pattern portion in a ULSI pattern has been developed. However, even the cell projection scheme has a much lower throughput than that of photolithography.

As a method of improving the throughput of electron beam lithography, mix and match has been proposed. In mix and match, light exposing and EB exposing are used to transfer a pattern to a resist. In this mix and match method, light exposing is used instead of EB exposing as far as it is possible, thereby improving the throughput.

However, the mix and match lithography technique suffers a problem that a pattern formed by light exposing is blurred by back scattered electrons. To solve this problem, complex data processing is required to design pattern data smaller than the actual pattern by any dimensional error expected to result from back scattered electrons.

A method using a phase shift mask is disclosed in Jpn. Pat. Appln. KOKAI Publication No. 4-155812. In this prior art, most pattern portions are transferred using a phase shift mask by light exposing, and only portions which have defects due to the phase shifter arrangement are corrected by an electron beam. With this process, the number of regions formed by the electron beam is minimized to improve the throughput. This method allows to reduce the number of regions formed. However, since a pattern having a resolution lower than the limit resolution of the phase shift mask cannot be transferred, this method cannot cope with device micropatterning in the future.

To manufacture a small number of devices of various types, it takes time to prepare masks. As a means for solving this problem, Jpn. Pat. Appln. KOKAI Publication No. 1-293616 discloses a method of transferring a common pattern to a resist by light exposing while forming a non-common portion using an electron beam. With this method, the number of masks can be small, so the mask preparation time can be shortened.

However, this method cannot cope with a case wherein a pattern having a resolution lower than the resolution of light used is present, like the above-described method using a phase shift mask. In addition, patterns to be formed by an electron beam are interconnection portions or the like. To expose such pattern using an electron beam, the pattern is formed by sequentially delineating one-dimensional segments, and this requires a long time. Hence, this method can hardly be applied to a lithography system for forming a fine pattern at high speed.

As described above, in the conventional mix and match method using light and electron beam for the same layer, which has been performed to improve the throughput, the resolution of EB exposing cannot be sufficiently exploited, and the throughput is lower than that of light exposing.

To solve the above problems, a lithography system capable of obtaining the resolution of an electron beam and the same throughput as that of a stepper has been proposed (Jpn. Pat. Appln. KOKAI Publication No. 9-46683). In this lithography system, a coating/developing equipment applies a resist on a wafer. The wafer with the resist is conveyed from the coating/developing equipment to a light stepper. In the light stepper, the resist is exposed by light. With this operation, a rough pattern is transferred to the resist. Next, the wafer is conveyed from the light stepper to an EB exposure equipment. In the EB exposure equipment, the resist is exposed by an electron beam. With this operation, a fine pattern is formed on the resist. In this process, cell projection is employed to improve the throughput.

As is known, the throughput of EB exposing is lower than that of light exposing. For this reason, a plurality of EB exposure equipments are arranged for one light stepper. Wafers processed by the light stepper are parallelly processed by the plurality of EB exposure equipments. After a rough pattern and fine pattern are formed, the wafer is conveyed to the coating/developing equipment and developed. With this process, the pattern is formed.

The resist usable in such a lithography system is a chemically amplified resist such as UV2HS or UVN-HS (available from Shiplay) with a high resolution and high sensitivity. Since the chemically amplified resist is modified to produce dimensional errors in the presence of various chemical substances in the air, the environment during conveyance must be controlled.

When such a lithography system is constructed, a device pattern including a fine pattern based on the 0.1-$\mu$m rule can be formed at a high throughput.

As described above in detail, a lithography system which forms a rough pattern by light exposing and a fine pattern by EB exposing acquires a high resolution of EB exposing and a high throughput of the light stepper.

However, the lithography system has the following problems. The lithography process is roughly classified into three steps: light exposing, EB exposing, and heating. The chemically amplified resist employed in this system consists of a polymeric material. The exposing process is classified into two stages. At the first stage, the resist portion irradiated with light or an electron beam absorbs the energy. A negative resist causes a crosslinking reaction to be insoluble while a positive resist causes a decomposition reaction to be readily soluble. At this first stage, an acid is generated in the resist in response to light or electron beam irradiation. Exposure at the next stage takes place when the polymeric material causes a crosslinking reaction (negative resist) or a decomposition reaction (positive resist) using the acid as a catalyst.

The acid diffuses or is deactivated in the resist during the interval from exposure to heating. This diffusion or deactivation generates a dimensional error, i.e., excessively thins or thickens the exposure pattern.

To reduce the dimensional error, the interval from exposure to heating need be shortened. However, in the above system, since the light stepper exposes the resist in the air while the EB exposure equipment exposes the resist in a vacuum atmosphere, not only the conveyance time from the light stepper to the EB exposure equipment and the EB exposing time but also an exhaust time need always be inserted between light exposing and EB exposing to change the environment from the atmospheric pressure state to the vacuum state. Therefore, the time from light exposing to heating cannot be largely shortened.

In addition, in this lithography system, several EB exposure equipments must be used to ensure a throughput suitable for a mass-production tool, resulting in a bulky system.

BRIEF SUMMARY OF THE INVENTION

It is an object of the present invention to provide a pattern forming method of forming a pattern on a resist by light exposing and EB exposing, which can suppress diffusion or deactivation of an acid generated in the resist upon exposing, thereby reducing any dimensional error.

In the first aspect of the present invention, a resist is heated after light exposing, and the resist is heated again after EB exposing. With this method, diffusion or deactivation of an acid can be suppressed, and any dimensional error can be reduced.

In the second aspect of the present invention, a resist is heated in an atmosphere containing an inert gas after light exposing, and the resist is heated again after EB exposing. When the resist is heated in the atmosphere containing the inert gas, the sensitivity lowers, so the light exposing time must be longer. For this reason, the throughput of light exposing lowers to be close to the throughput of EB exposing. Hence, the waiting time between light exposing and EB exposing shortens.

In the third aspect of the present invention, a resist is exposed with light before development to supplement EB exposing. In other words, by this exposure, the electron beam dose can be reduced, and the throughput of EB exposing can be made high. Therefore, the waiting time between light exposing and EB exposing shortens, and the system throughput increases.

In the fourth aspect of the present invention, a resist is exposed with an electron beam, heated, exposed with a light beam, and then heated again. The EB-exposed resist portion is heated twice. The resist exposure sensitivity is higher in two heating processes than in one heating process. Since the EB exposing sensitivity becomes high, the electron beam dose can be reduced, and the throughput of EB exposing can be raised. Hence, the waiting time between light exposing and EB exposing shortens, and the system throughput increases.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

First Embodiment

Figure 1A:
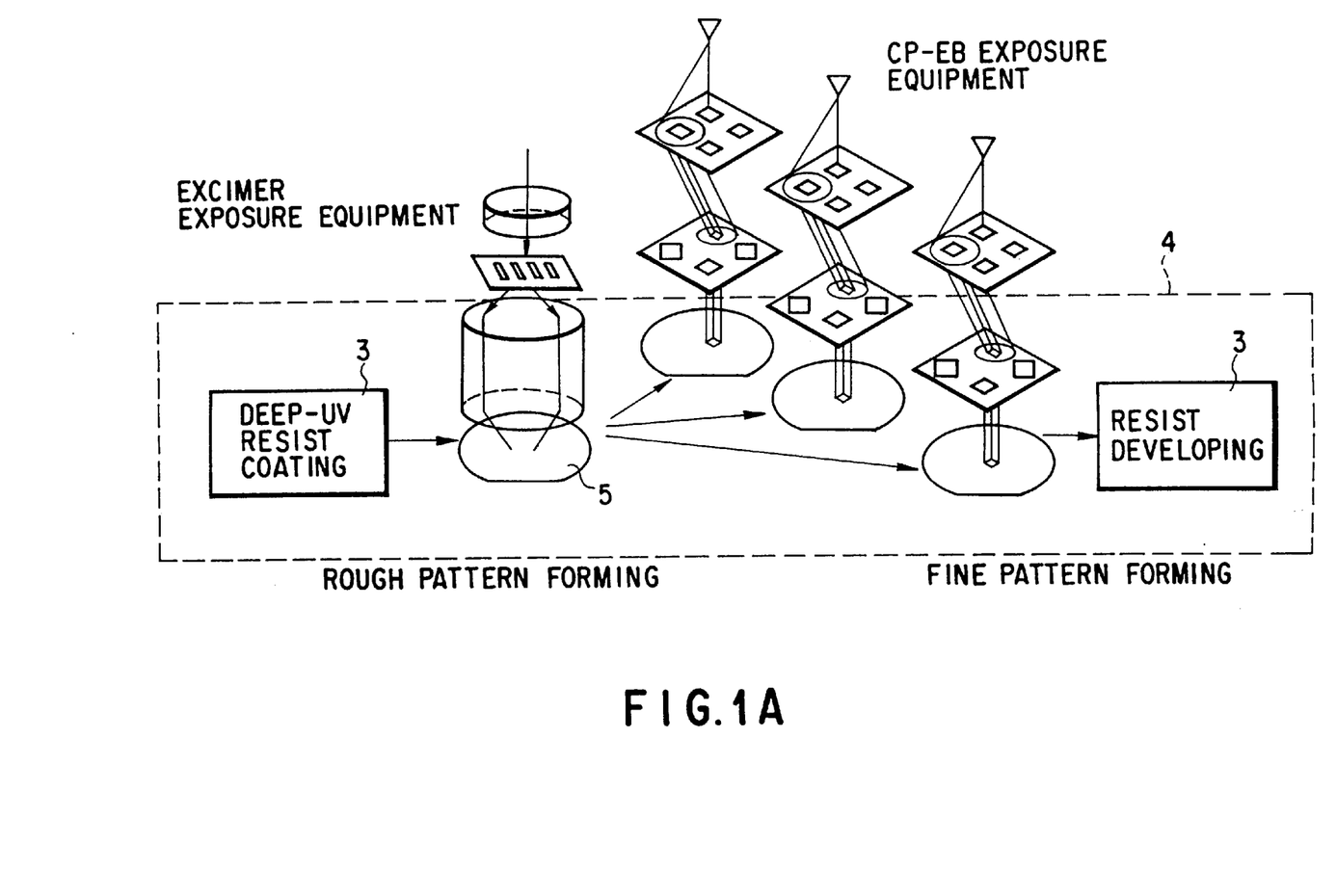
FIG. 1A is a view showing the schematic arrangement of a lithography system associated with a pattern forming method according to the first embodiment of the present invention.
Figure 1B:
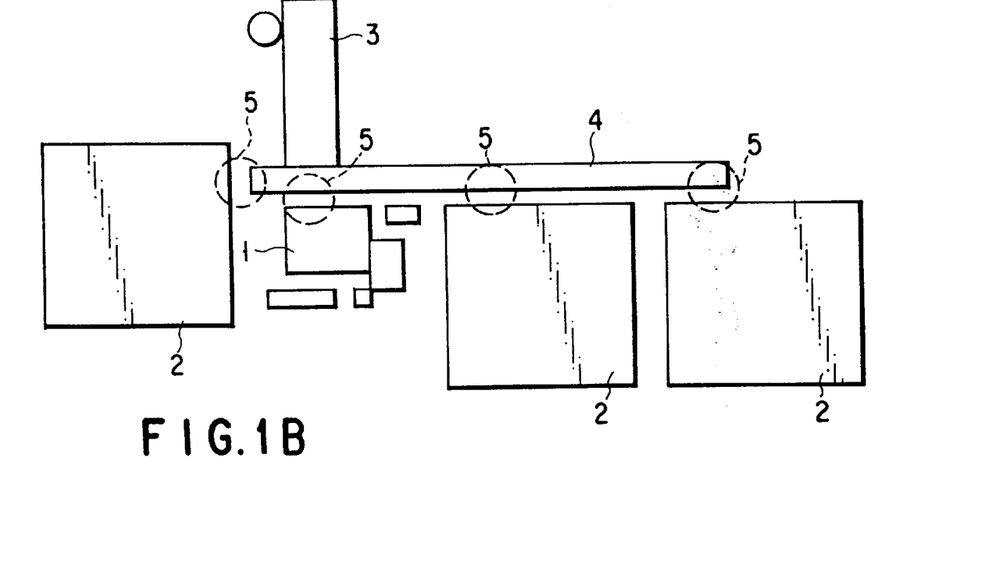
FIG. 1B is a plan view of the lithography system shown in FIG. 1A.

FIG. 1A shows the schematic arrangement of a lithography system associated with a pattern forming method according to the first embodiment. FIG. 1B is a plan view of the lithography system shown in FIG. 1A. Referring to FIGS. 1A and 1B, a light stepper 1 is a Deep-UV stepper using an excimer laser beam. One or a plurality of EB exposure equipments 2 of a cell projection scheme are arranged in correspondence with one light stepper 1. A resist coating/developing equipment 3 has a function of applying a resist on a wafer 5, a function of heating the resist in a heating chamber, and a function of developing the resist on which a pattern is formed. A conveyance mechanism 4 conveys the resist in controlled atmospheres among the light stepper 1, the EB exposure equipment 2, and the resist coating/developing equipment 3.

Figure 2:
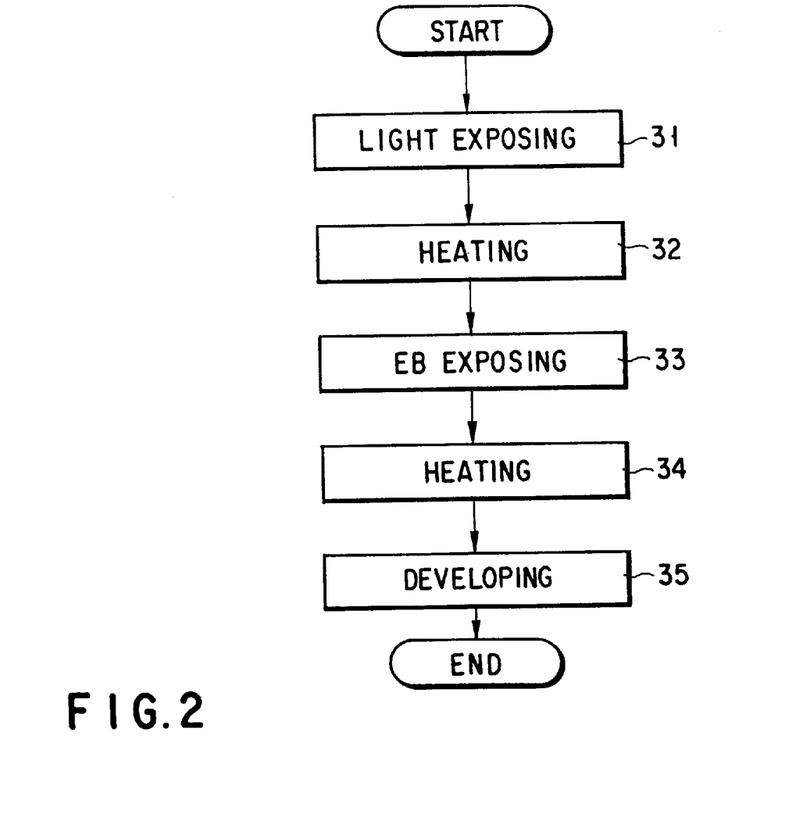
FIG. 2 is a flow chart of the pattern forming method according to the first embodiment.

FIG. 2 is a flow chart of the pattern forming method according to the first embodiment. The wafer 5 applied with a resist by the resist coating/developing equipment 3 is conveyed to the light stepper 1 by the conveyance mechanism 4. In the light stepper 1, the resist is exposed by light through a mask (step 31). With this process, a rough pattern is formed on the resist.

When light exposing is ended, the wafer 5 is conveyed to the resist coating/developing equipment 3 by the conveyance mechanism 4 and heated in step 32 (Post Exposure Bake: PEB).

Next, the wafer 5 is conveyed to the EB exposure equipment 2 by the conveyance mechanism 4. In the EB exposure equipment 2, the position of the wafer 5 is adjusted first. After the position adjustment, the resist is exposed by an electron beam (EB). With this process, a fine pattern is formed on the resist (step 33).

To increase the throughput of EB exposing, a repeated pattern is formed by cell projection. When a plurality of EB exposure equipments 2 are assigned to one light stepper 1, the wafers 5 delivered from the light stepper 1 can be parallelly processed by the plurality of EB exposure equipments 2. With this arrangement, the processing capability of the light stepper 1 is not rate-determined by that of the EB exposure equipment 2, and a high throughput is obtained.

After EB exposing, i.e., after a rough pattern and fine pattern are formed on the resist, the wafer 5 is returned to the resist coating/developing equipment 3 by the conveyance mechanism 4. In the resist coating/developing equipment 3, the resist is heated again (step 34).

Finally, the resist is developed in the resist coating/developing equipment 3 (step 35).

As described above, in addition to heating the resist after light exposing and EB exposing are complete as in the prior art, the resist is heated even after light exposing, thereby even if a waiting time is extended, diffusion or deactivation of an acid generated in the resist upon light exposing can be suppressed, and any dimensional error can be reduced.

For this pattern forming method, a chemically amplified resist (UV2HS or UVN-HS available from Shiplay) having a high sensitivity and high resolution is employed. Since the performance of a chemically amplified resist degrades due to various chemical substances in the air, the chemically amplified resist is handled under controlled environments in or among the equipments 1, 2, and 3. With this environment control, not only chemical contamination but also physical contamination, temperature, and humidity are controlled.

Figure 3:
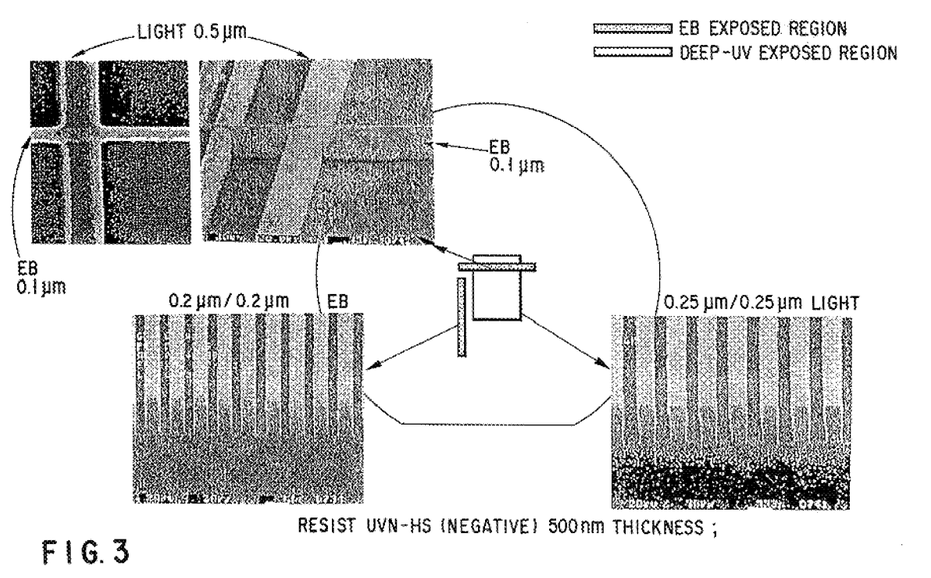
FIG. 3 is a photomicrograph of a resist pattern formed by the pattern forming method of the first embodiment.

FIG. 3 is a photomicrograph of a resist pattern formed by the pattern forming method of the first embodiment. On a negative chemically amplified resist UVN having a thickness of 0.5 $\mu$m, a rough pattern having a size of 0.25 $\mu$m or more was transferred using the Deep-UV stepper. Immediately after this, the resist was heated at 120° C. for 60 sec. The resist was conveyed to the EB exposure equipment. A fine pattern smaller than 0.25 $\mu$m was formed on the resist. Immediately after this, the resist was heated at 120° C. for 60 sec. Finally, the resist was developed. As the developing agent, an aqueous solution of TMAH was used. The developing condition was 60 sec and 0.27 N.

As shown in FIG. 3, a pattern with a size of 0.1 $\mu$m is reliably formed, and very high resolution is realized.

Table 1 shows the calculation results of the system throughput of this pattern forming method. This calculation assumes that 100 gate layers of 256M DRAMs based on the 0.15-$\mu$m rule were arrayed on an 8-inch wafer. The sensitivity of the resist was 10 $\mu$C/cm$^2$. One light stepper 1 and one EB exposure equipment 2 were arranged.

TABLE 1

|  | ONLY EB-LITHOGRAPHY | LIGHT/EB SAME LAYER Mix & Match |
|---|---|---|
|  | MEMORY CELL: CP | MEMORY CELL: CP |
|  | PERIPHERAL CIRCUIT: VSB | PERIPHERAL CIRCUIT: Deep UV |
| EVALUATION SAMPLE 256 MDRAM GATE LAYER | 0.3 WAFER/h | 2.84 WAFER/h |

| TRIAL CONDITION: | WAFER | 8 INCH |
|---|---|---|
|  | THE NUMBER OF CHIPS | 100/WAFER |
|  | CP-EB EQUIPMENT | HITACHI HL-800D |

When the resist was exposed only by EB exposing of the cell projection scheme, the throughput was 0.3 wafers/h. To the contrary, when a rough pattern having a size of 0.25 $\mu$m or more was exposed by light using a Deep-UV stepper, and a fine pattern having a size smaller than 0.25 $\mu$m was exposed by EB exposing of the cell projection scheme, the throughput was 2.8 wafers/h, i.e., higher than that obtained using only EB exposing.

The foregoing suggests that when three EB exposure equipments 2 are arranged in correspondence with one light stepper to parallelly process light-exposed wafers by the three EB exposure equipments 2, a throughput sufficiently suitable for mass-production tool can be ensured.

Figure 4:
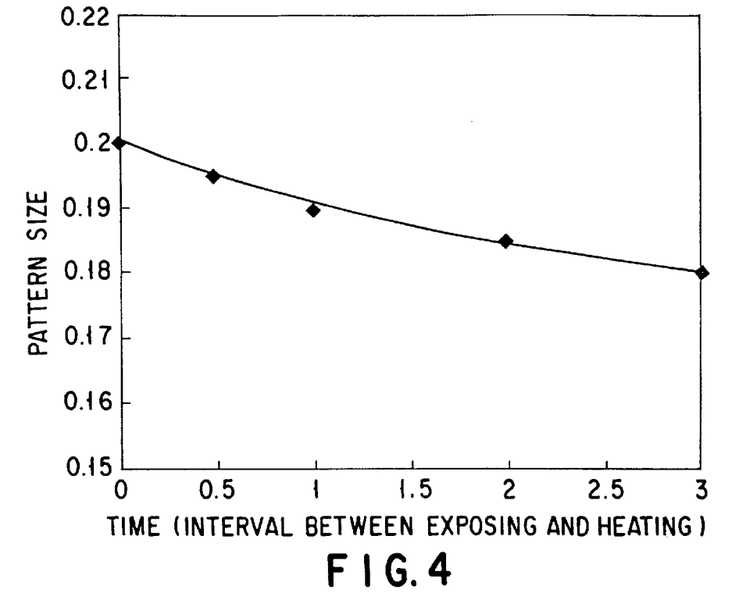
FIG. 4 is a graph showing the dependence of the pattern size on the interval between light exposing and heating.

FIG. 4 shows a change in size of a negative resist pattern with respect to the interval between light exposing and heating (PEB). The abscissa represents the interval between light exposing and heating, and the ordinate represents the pattern size. As shown in FIG. 4, a light-exposed pattern having a size of about 0.2 $\mu$m thins out to about 0.18 $\mu$m after 3 hrs.

Figure 5A:
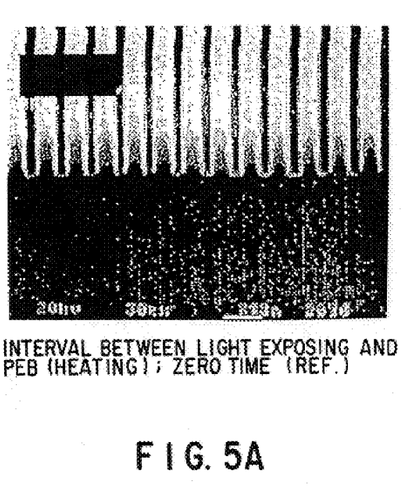
FIG. 5A is a photomicrograph of a resist pattern formed when the interval between light exposing and heating was zero.
Figure 5B:
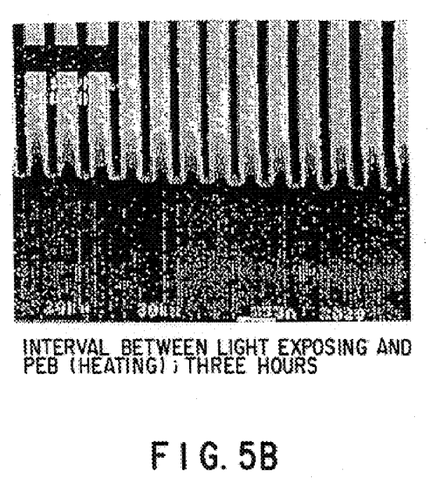
FIG. 5B is a photomicrograph of a resist pattern formed when the interval between light exposing and heating was 3 hrs.

FIG. 5A is a photomicrograph of a resist pattern formed when the interval between light exposing and heating was zero, i.e., the resist was heated immediately after light exposing. FIG. 5B is a photomicrograph of a resist pattern formed when the interval between light exposing and heating was 3 hrs, i.e., the resist was heated 3 hrs after light exposing. Heating was performed at 120° C. for 60 sec. The developing condition was the same as that in FIG. 3. As shown in FIG. 5B, the acid generated in the resist diffused in about 3 hrs to produce a dimensional error. Consequently, the line width was reduced from about 0.2 μm to about 0.18 μm. As is apparent from this result, as the interval between light exposing and heating becomes smaller, the dimensional error due to acid diffusion is reduced.

Figure 6A:
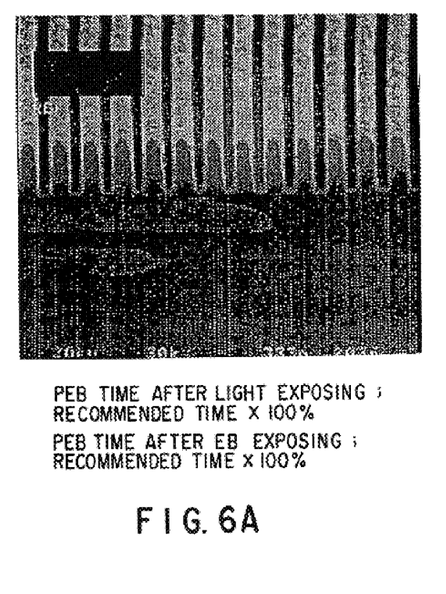
FIG. 6A is a photomicrograph of a resist pattern formed when the heating time after light exposing and the heating time after EB exposing were maker-recommended times× 100%, respectively.
Figure 6B:
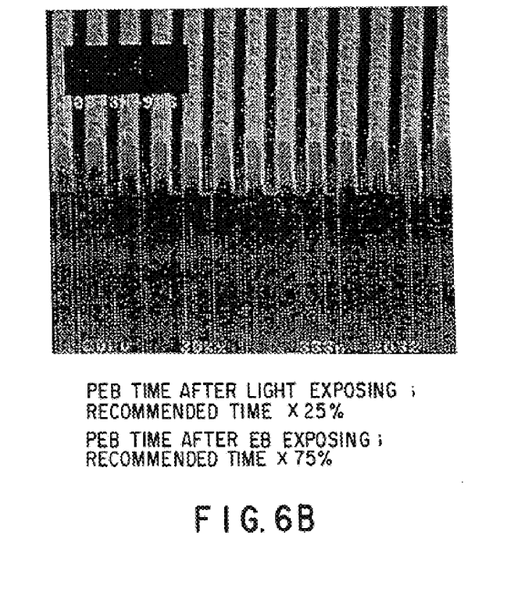
FIG. 6B is a photomicrograph of a resist pattern formed when the heating time after light exposing was maker-recommended time×25% and the heating time after EB exposing was maker-recommended time×75%.

FIG. 6A is a photomicrograph of a resist pattern formed when the heating time after light exposing and the heating time after EB exposing were maker-recommended times× 100%, respectively. FIG. 6B is a photomicrograph of a resist pattern formed when the heating time after light exposing was maker-recommended time×25% and the heating time after EB exposing was maker-recommended time×75%. The heating time recommended by the maker is a time required to completely expose the resist. For example, when the temperature is 120° C., the heating time is 60 sec.

When the heating time after light exposing is 25% of the recommended time and the heating time after EB exposing is 75% of the recommended time so that the total of the heating time after light exposing and that after EB exposing becomes 100% of the maker-recommended time, the crosslinking reaction or decomposition reaction of the resist polymeric material due to the acid generated after light exposing as a catalyst does not sufficiently progress, resulting in a dimensional error.

The heating time after light exposing is preferably set to be maker-recommended time×100%, like the heating time after EB exposing. In addition, when the heating time is equal to or shorter than 75% of the maker-recommended time, acid diffusion cannot be completely stopped, resulting in a conspicuous dimensional error. Therefore, each of the heating time after light exposing and the heating time after EB exposing is preferably at least maker-recommended time×75% and, more preferably, maker-recommended time× 100%.

As shown in FIG. 6A, when the resist is heated after light exposing for 100% of the maker-recommended time, and the resist is heated after EB exposing for 100% of the maker-recommended time, the time for which the light-exposed portion is heated is 200% of the maker-recommended time, and this may result in a dimensional error due to excessive resist sensitivity. In fact, a light exposing time is adjusted based on a dimensional change, so no dimensional error is appeared.

According to this embodiment, since the resist is heated after light exposing, and the resist is heated again after EB exposing, the interval between light exposing and heating and that between EB exposing and heating can be shortened. Consequently, diffusion or deactivation of the acid generated in the resist upon exposure can be suppressed, and any dimensional error can be reduced.

In this embodiment, as the light stepper 1, the Deep-UV stepper is used. However, a stepper in another wavelength band may be used. As the EB exposure equipment 2, an equipment of the cell projection scheme is used. However, a forming method based on normal EB exposing may be used.

In this embodiment, exposure is performed using an electron beam. However, the present invention can also be applied to exposure using a charged beam such as an ion beam.

Second Embodiment

Figure 7:
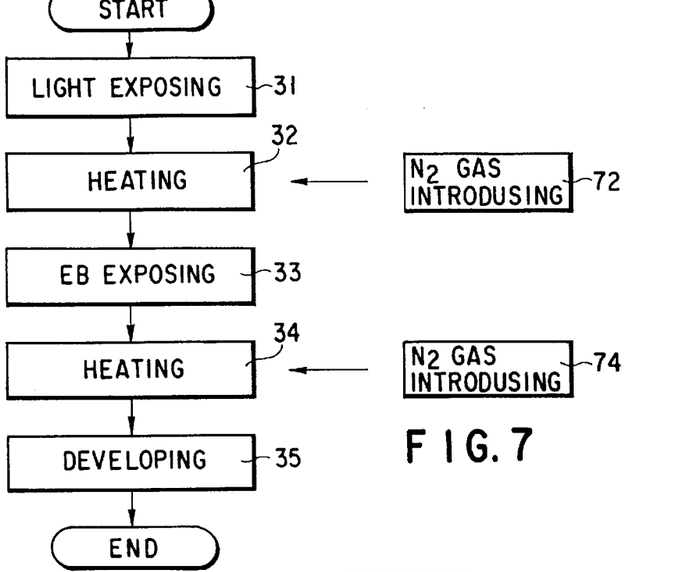
FIG. 7 is a flow chart of a pattern forming method according to the second embodiment of the present invention.

FIG. 7 is a flow chart of a pattern forming method according to the second embodiment of the present invention. The same reference numerals as in FIG. 2 denote the same steps in FIG. 7. A lithography system associated with the pattern forming method of the second embodiment basically has the same arrangement as that shown in FIGS. 1A and 1B. However, a resist coating/developing equipment 3 has not only the above-described functions but also a function of introducing a specific gas into the heating chamber and heating a wafer 5 in an atmosphere containing the specific gas. The specific gas is an inert gas such as $N_2$, wet $O_2$, dry $O_2$, or $H_2O$.

As the characteristic feature of this embodiment, an inert gas such as $N_2$ is introduced into the heating chamber in step 72, and the resist exposed only by light exposing is heated in the inert gas atmosphere of $N_2$ or the like in step 32. In FIG. 7, an inert gas such as $N_2$ is introduced into the heating chamber in step 74, and the resist exposed by both light exposing and EB exposing is heated in the inert gas atmosphere of $N_2$ or the like in step 34. However, this process is not essential. In step 34, the resist may be heated in the air.

Figure 8:
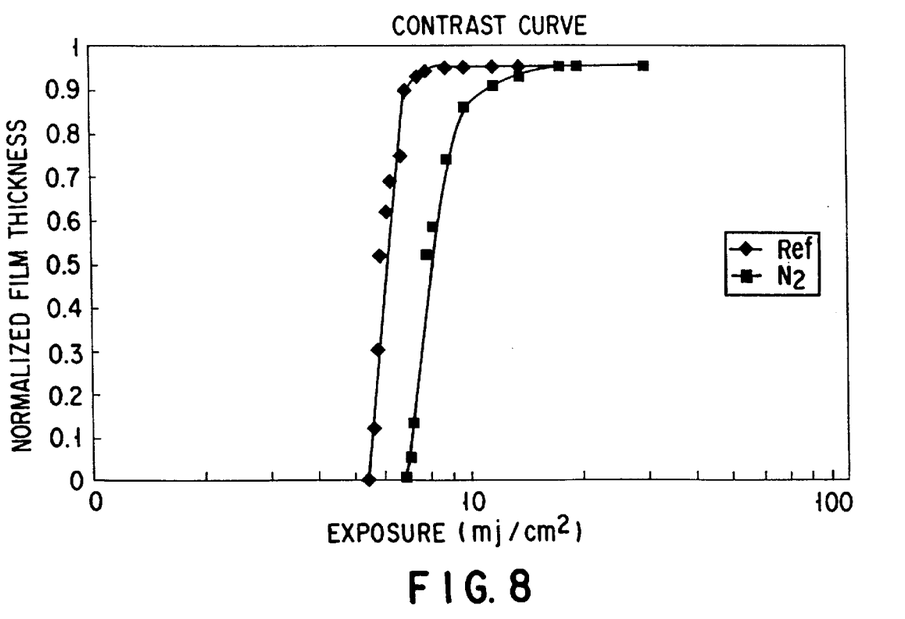
FIG. 8 is a graph showing the exposure sensitivity of a resist heated in $N_2$ gas in the second embodiment.

FIG. 8 shows the dependence of the resist sensitivity on the exposure when the resist is heated in an atmosphere containing $N_2$ gas at a concentration of 3 cc/min after light exposing. The abscissa represents the exposure, and the ordinate represents the normalized film thickness. The resist sensitivity upon heating the resist in the air is indicated by ■, and the resist sensitivity upon heating the resist in the atmosphere containing the $N_2$ gas is indicated by ♦. As is apparent from FIG. 8, the resist sensitivity upon heating the resist in the $N_2$ gas is obviously lower than that upon heating the resist in the air. For example, the exposure necessary for completely removing the exposed portion (normalized film thickness is zero) is 5.5 $mJ/cm^2$ in the air, and 6.7 $mJ/cm^2$ in the atmosphere containing the $N_2$ gas.

When the resist after light exposing and before EB exposing is heated in the inert gas atmosphere, the resist sensitivity for light exposing can be intentionally lowered. When the resist sensitivity lowers, the light exposure (dose) can be increased, i.e., the light exposing time can be prolonged to compensate for the lower resist sensitivity. When the light exposing time becomes longer, the throughput of light exposing lowers to be close to that of EB exposing. Ideally, the throughput of light exposing can be lowered to be almost the same as that of EB exposing. With this method, ideally, even when one EB exposure equipment 2 is arranged in correspondence with one light stepper 1, the resist process smoothly flows from the light exposing process to the EB exposing process, i.e., without any waiting time.

Therefore, the design rule for the lithography system is simplified. In addition, a lot of EB exposure equipments 2 need not be arranged in correspondence with one light stepper 1. One or a few EB exposure equipments 2 suffice for one light stepper 1, so the lithography system can be made compact.

As another example for obtaining the same effect as described above, the resist sensitivity may be lowered before light exposing, or the resist sensitivity may be lowered after light exposing and before EB exposing.

Third Embodiment

In the second embodiment, the throughput of light exposing is lowered to that of EB exposing. In the third embodiment, the throughput of EB exposing is raised to that of light exposing. A lithography system for realizing a pattern forming method according to the third embodiment basically has the same arrangement as that shown in FIGS. 1A and 1B.

Figure 9A:
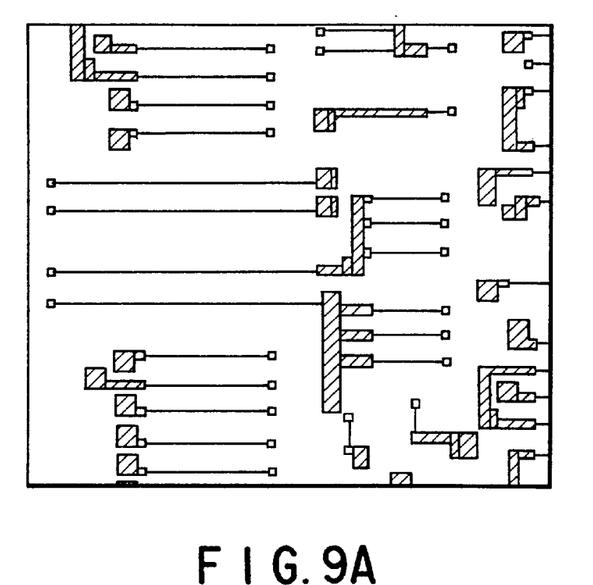
FIG. 9A is a view showing pattern data to be processed by a pattern forming method according to the third embodiment of the present invention.

FIG. 9A schematically shows pattern data used in the third embodiment. The hatched portions indicate a rough pattern formed by light exposing using Deep-UV or the like, and the remaining portions correspond to a fine pattern formed with an electron beam. The rough pattern and fine pattern are formed by mix and match on the same layer.

Figure 10:
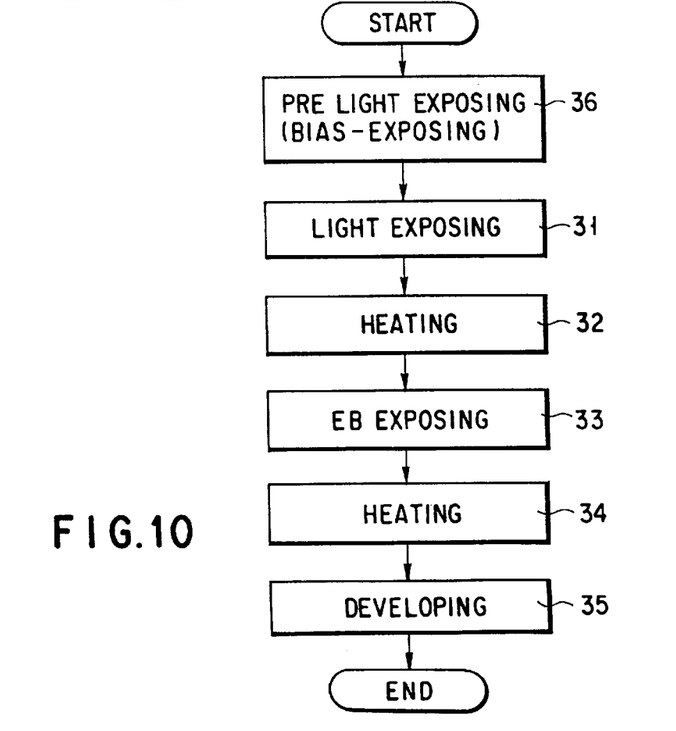
FIG. 10 is a flow chart of the pattern forming method according to the third embodiment of the present invention.

FIG. 10 shows the flow of the pattern forming method of the third embodiment. The same reference numerals as in FIG. 2 denote the same steps in FIG. 10. As the characteristic feature of this embodiment, before or after EB exposing step 33, or in FIG. 10, before EB exposing step 33 and before light exposing step 31, the resist is exposed to some extent, i.e., incompletely exposed (step 36). With this process, the exposure of the electron beam can be small, and accordingly, the throughput of EB exposing becomes high. This pre-exposing will be called bias-exposing. In bias-exposing, the resist is not completely exposed, so the resolution in main light exposing and that in EB exposing do not lower.

Bias-exposing can be performed independently of use of a reticle mask. When a reticle mask is to be used, the light-transmitting portion of the reticle mask may be the same as the fine pattern or as the light-shielding pattern of the reticle for main light exposing in step 31. When the light-transmitting portion of the reticle mask is the same as the fine pattern, only resist portions where the fine pattern is to be formed in the EB exposing step are exposed in the bias-exposing step. When the light-transmitting portion of the reticle mask is the same as the light-shielding pattern of the reticle mask for main light exposing in step 31, resist portions other than the region where the rough pattern is to be formed in the main light exposing step are exposed in the bias-exposing step.

Figure 9B:
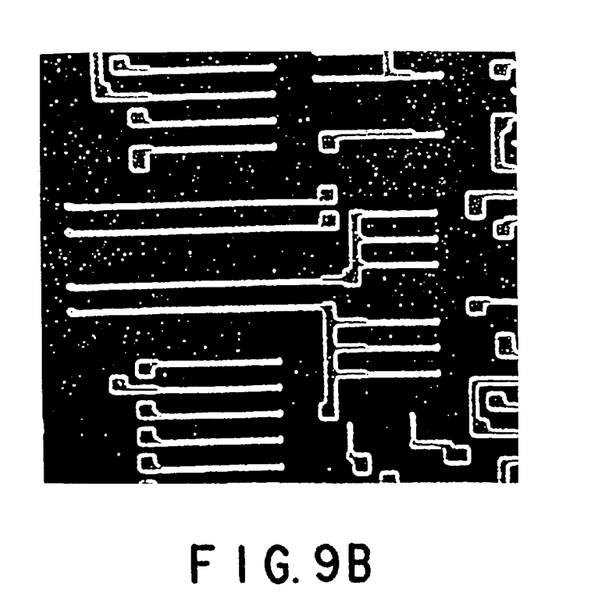
FIG. 9B is a photomicrograph of a resist pattern formed according to the pattern data shown in FIG. 9A in the third embodiment.

After bias-exposing, a rough pattern is formed on the resist by light exposing using a light stepper 1 (step 31), the resist is heated (step 32), a fine pattern is formed on the resist by EB exposing using an EB exposure equipment 2 (step 33), the resist is heated (step 34), and the resist is developed finally (step 35), as in FIG. 2. FIG. 9B is a photomicrograph of the developed resist pattern.

Figure 11:
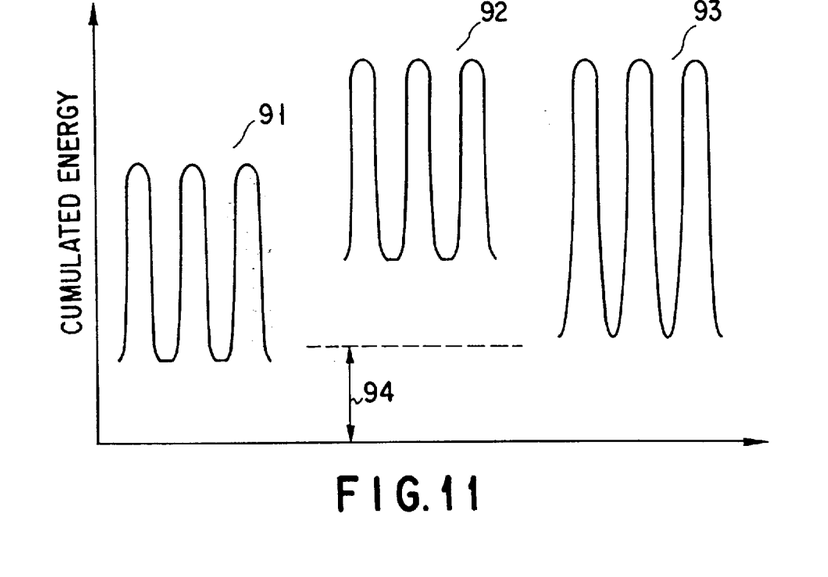
FIG. 11 is a graph showing the cumulated energy in the resist.

The mechanism for increasing the throughput of EB exposing by bias-exposing will be described next with reference to FIG. 11. FIG. 11 shows an energy amount 91 cumulated in the resist upon EB exposing in step 33, a total energy amount 92 of the energy amount cumulated in the resist upon light bias-exposing and the energy amount cumulated in the resist upon EB exposing, and a cumulated energy amount 93 necessary for completely exposing the resist and removing the exposed portion.

The energy cumulated in the fine pattern portion of the resist exposed with an electron beam corresponds to the total energy amount 92 of cumulated energy 94 upon bias-exposing and the cumulated energy 91 upon EB exposing. The cumulated energy 94 upon bias-exposing and the cumulated energy 91 upon EB exposing are complementarily adjusted such that the total energy amount 92 exceeds the cumulated energy amount 93 necessary for completely exposing the resist. In other words, the cumulated energy 94 upon bias-exposing and the cumulated energy 91 upon EB exposing are complementarily adjusted to compensate for a shortage in EB exposing by bias-exposing.

The cumulated energy 94 upon bias-exposing must be adjusted not to exceed the cumulated energy amount 93 necessary for completely exposing the resist. This is because when the cumulated energy 94 upon bias-exposing exceeds the cumulated energy amount 93 necessary for completely exposing the resist, the entire surface of the resist is completely exposed, and no pattern can be formed on the resist, or no fine pattern can be formed on the resist.

With bias-exposing, the exposure of the electron beam can be reduced as compared to a case wherein bias-exposing is not performed. Therefore, the electron beam scanning speed can be increased to raise the throughput of EB exposing.

Bias-exposing is required in exchange for an increase in throughput of EB exposing. However, since the time required for bias-exposing is much shorter than the decrease in EB exposing time, the system throughput of the entire lithography system becomes high.

For example, a rough pattern having a size of 0.25 $\mu$m or more is exposed with far UV light using a Deep-UV stepper, and a pattern smaller than the resolution limit of the stepper is exposed with an electron beam using cell projection. In this case, the system throughput is 2.8 wafers/h. When bias-exposing is combined, the system throughput is 3.7 wafers/h or much higher than that of the system without bias-exposing. The throughput of the lithography system is largely improved by using light bias-exposing.

Figure 12A:
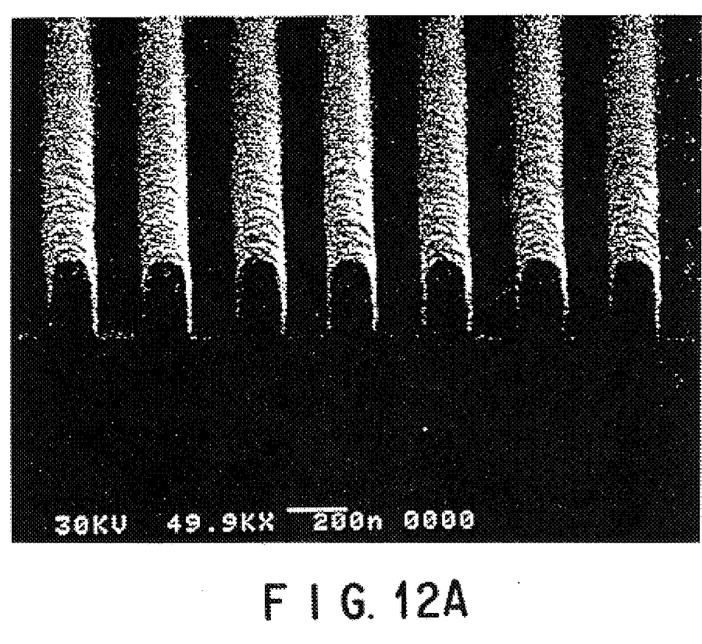
FIGS. 12A and 12B are photomicrographs of sections of resist patterns formed by the pattern forming method of the third embodiment.
Figure 12B:
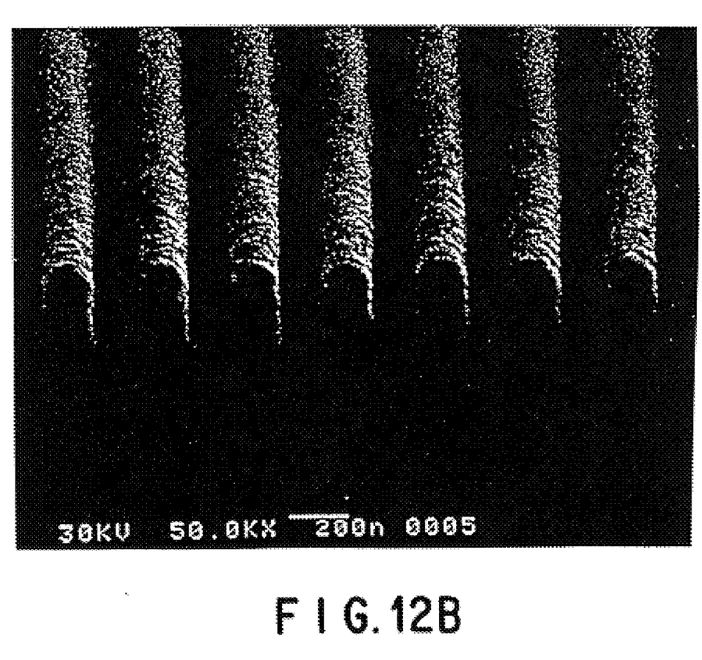

FIG. 12A is a photomicrograph showing a section of a resist pattern formed by the pattern forming method, i.e., by forming a pattern having a size of 0.15 $\mu$m on a negative, chemically amplified resist UVN having a thickness of 0.3 $\mu$m with an electron beam at an acceleration voltage of 50 kV, performing bias-exposing using a Deep-UV stepper, and then developing the resist. FIG. 12B is a photomicrograph of a resist pattern formed without bias-exposing. When light bias-exposing is not performed, a dose of 15 $\mu$C/cm$^2$ is required to form a pattern having a size of 0.15 $\mu$m only with an electron beam. However, when bias-exposing is performed at 5 mJ/cm$^2$, a pattern having a size of 0.15 $\mu$m can be formed only with an electron beam dose of 11 $\mu$C/cm$^2$. When bias-exposing is performed, the electron beam dose can be reduced to around $^2/_3$ that in case without bias-exposing.

Table 2 shows the calculation results of the throughput of this pattern forming method. This calculation assumes that one EB exposure equipment is arranged in correspondence with one stepper, and 100 gate layers of 256M DRAMs based on the 0.15-$\mu$m rule are arrayed on an 8-inch wafer. The sensitivity of the resist was 10 $\mu$C/cm$^2$. The EB forming equipment used for this calculation was HL-800D available from Hitachi.

TABLE 2

| | LIGHT/EB SAME Mix & Match MEMORY CELL: CP PERIPHERAL CIRCUIT: Deep UV | LIGHT/EB SAME LAYER Mix & Match + LIGHT BIAS EXPOSURE MEMORY CELL: CP PERIPHERAL CIRCUIT: Deep UV |
|---|---|---|
| EVALUATION SAMPLE 256 MDRAM GATE LAYER | 2.84 WAFER/h | 3.75 WAFER/h |
| TRIAL CONDITION: | WAFER THE NUMBER OF CHIPS CP-EB EQUIPMENT | 8 INCH 100/WAFER HITACHI HL-800D |

This calculation was performed with reference to ① Y. Nakayama et al., J. Vac. Sci. Technol., B8 (6), 1990, p. 1836, ② Y. Shoda et al., J. Vac. Sci. Technol., B9 (6), 1991, p. 2940, and ③ H. Itoh et al., J. Vac. Sci. Technol., B10 (6), 1992, p. 2799.

Fourth Embodiment

Figure 13:
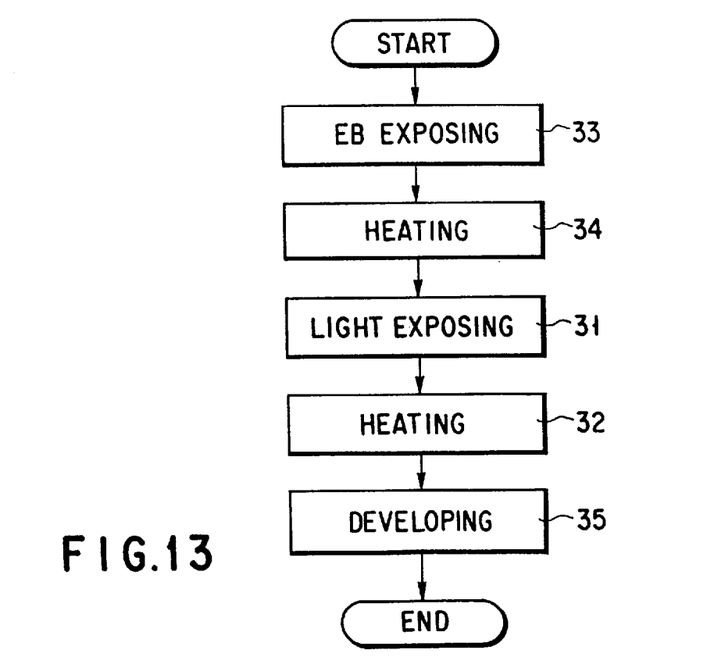
FIG. 13 is a flow chart of a pattern forming method according to the fourth embodiment.

FIG. 13 shows the flow of a pattern forming method according to the fourth embodiment of the present invention. The same reference numerals as in FIG. 2 denote the same steps in FIG. 13. A lithography system for practicing the pattern forming method of this embodiment basically has the same arrangement as that shown in FIGS. 1A and 1B, and a detailed description thereof will be omitted.

The pattern forming method using the above system will be described next. As the characteristic feature of the fourth embodiment, EB exposing step 33 is performed before light exposing step 31. That is, an exposing step with a relatively low throughput is performed before the step with a relatively high throughput. As in the above embodiments, step 34 of heating the resist is performed immediately after EB exposing step 33, and step 32 of heating the resist is performed immediately after light exposing step 31.

The fine pattern portion of the resist, which is exposed by EB exposing with a relatively low throughput, is heated twice in steps 34 and 32. The rough pattern portion of the resist, which is exposed by light exposing with a relatively high throughput, is heated only once in step 32.

Figure 14:
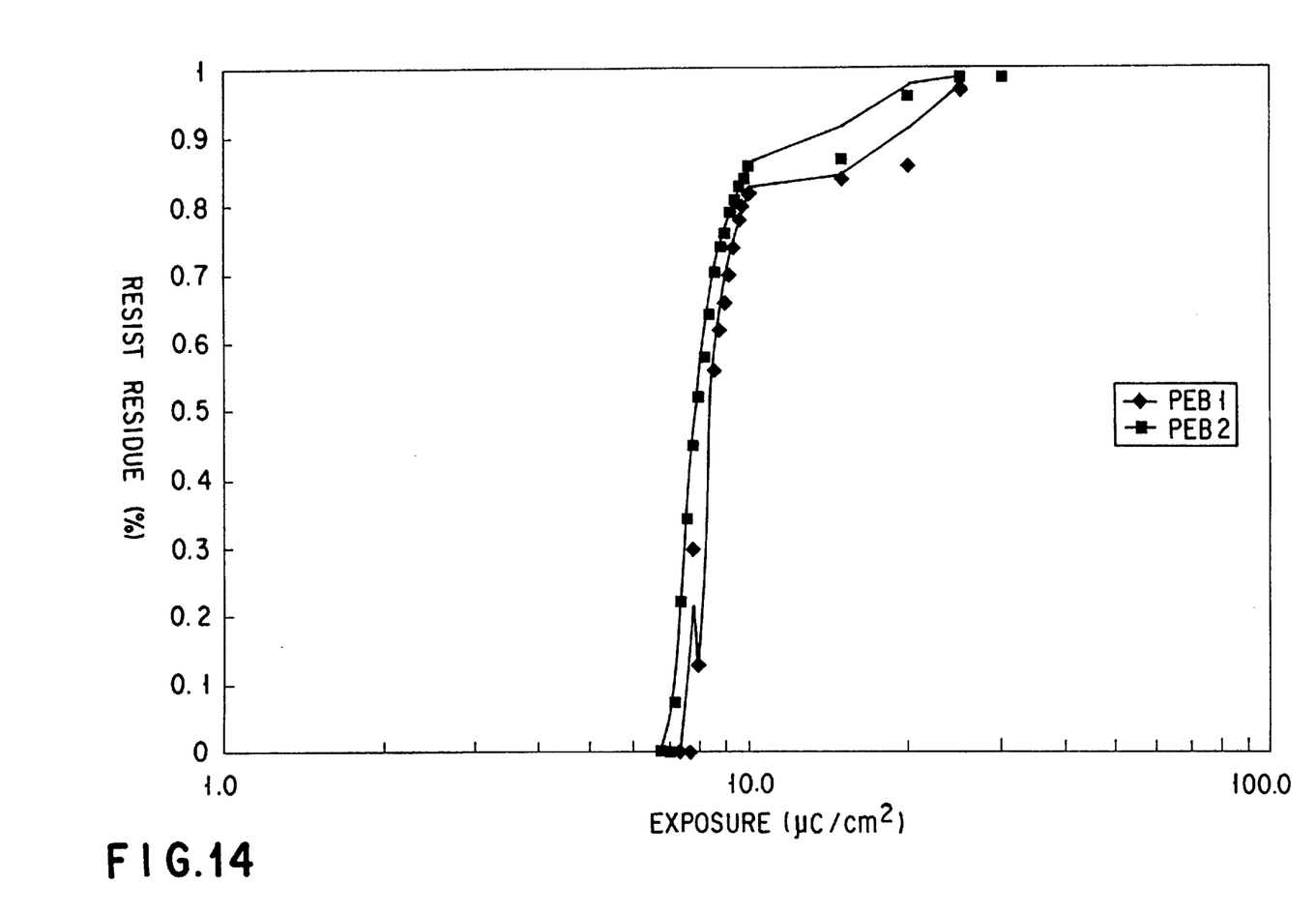
FIG. 14 is a graph showing the exposure sensitivity of a resist when EB exposing is done before light exposing in the fourth embodiment.

FIG. 14 shows a resist sensitivity curve (♦) upon heating the resist only once and that (■) upon heating the resist twice. As can be seen from FIG. 14, the resist sensitivity upon heating the resist twice is higher than that upon heating the resist only once. This means that the electron beam exposure can be reduced. Thus, the throughput of EB exposing increases, and so the system throughput also increases.

Figure 15:
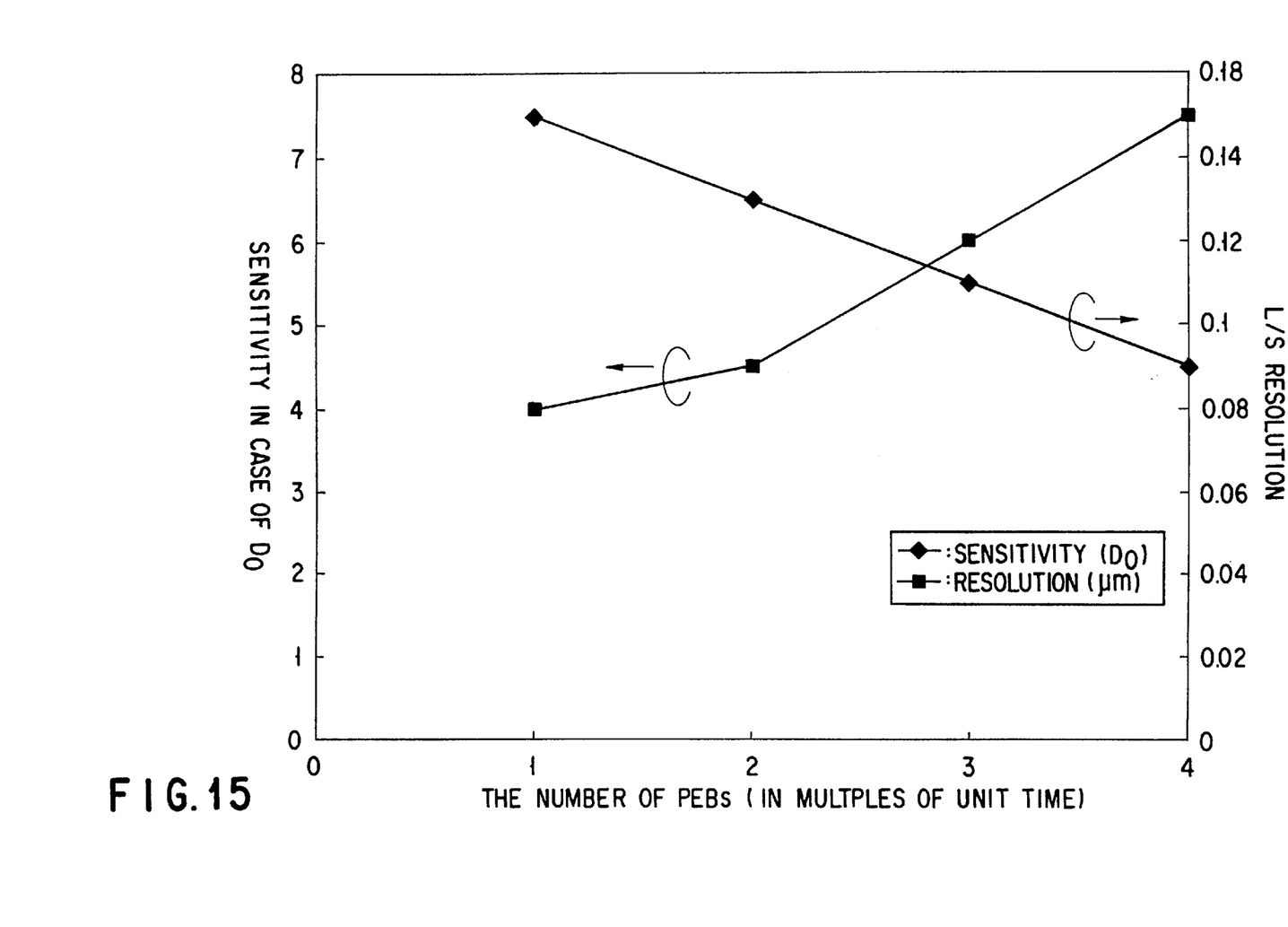
FIG. 15 is a graph showing the dependence of the exposure sensitivity of a resist on the number of heating processes (heating time) in the fourth embodiment.

However, as is apparent from the relationship between the heating time (=unit heating time per cycle×the number of heating processes) and the resolution shown in FIG. 15, as the heating time becomes long, the sensitivity rises while the resolution falls. Therefore, the heating time must be adjusted to achieve the required resolution, and for example, to be shorter than the heating time corresponding to the intersection of the sensitivity curve and the resolution curve.

As described above in detail, according to this embodiment, when EB exposing having a low throughput is performed before light exposing having a high throughput, the EB-exposed portion is heated twice, resulting in higher sensitivity for the electron beam. The throughput of EB exposing increases due to increased sensitivity, and the system throughput increases to increased throughput of EB exposing.

The present invention is not limited to the above-described embodiments, and various changes and modifications can be made. Even when light bias-exposing is performed not before reticle mask pattern exposure but after reticle mask pattern exposure or after EB exposing, the same effect as described above can be obtained. The equipment used for light bias-exposing is not limited to the light stepper 1. A means for exposing the resist by passing the wafer 5 under a mercury lamp inserted in the conveyance path before and after light exposing or before and after EB exposing may be used. The energy beam used for light bias-exposing may be, e.g., an X-ray, and any other ray can be used as far as the region where the pattern is to be formed with an electron beam can be fully irradiated.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A pattern forming method comprising the steps of:
   forming a rough pattern on a resist by light exposing;
   heating the resist after light exposing;
   forming a fine pattern on the resist by charged beam exposing;
   heating the resist after charged beam exposing; and
   developing the resist on which the rough pattern and the fine pattern are formed.

2. A method according to claim 1, wherein the resist is a chemically amplified resist having sensitivity for both an electron beam and a light beam.

3. A method according to claim 2, wherein, in the step of heating the resist after light exposing, a heating time is adjusted to a time required to substantially complete a crosslinking reaction or a decomposition reaction of a polymeric material due to an acid as a catalyst, the acid being generated in the resist upon light exposing.

4. A method according to claim 2, wherein, in the step of heating the resist after charged beam exposing, a heating time is adjusted to a time required to substantially complete a crosslinking reaction or a decomposition reaction of a polymeric material due to an acid as a catalyst, the acid being generated in the resist upon charged beam exposing.

5. A method according to claim 1, wherein a heating time when the resist is heated after light exposing is adjusted to be substantially the same as a heating time when the resist is heated after charged beam exposing.

6. A pattern forming method comprising the steps of:
   forming a rough pattern on a resist by light exposing;
   heating the resist in an atmosphere containing an inert gas after light exposing;
   forming a fine pattern on the resist by charged beam exposing;
   heating the resist in an atmosphere containing an inert gas after charged beam exposing; and
   developing the resist on which the rough pattern and the fine pattern are formed.

7. A method according to claim 6, wherein the inert gas is a material selected from the group consisting of $N_2$ gas, wet $O_2$ gas, dry $O_2$ gas, and $H_2O$ gas.

8. A pattern forming method comprising the steps of:
   forming a rough pattern on a resist by light exposing;
   heating the resist after light exposing;
   forming a fine pattern on the resist by charged beam exposing;
   heating the resist after charged beam exposing;
   developing the resist on which the rough pattern and the fine pattern are formed; and
   exposing the resist before the developing step to assist in charged beam exposing.

9. A method according to claim 8, wherein the step of exposing the resist to assist in charged beam exposing is performed before the step of forming the rough pattern on the resist by light exposing.

10. A method according to claim 8, wherein the step of exposing the resist to assist in charged beam exposing comprises exposing the resist with a light beam.

11. A method according to claim 8, wherein the step of exposing the resist to assist in charged beam exposing comprises exposing an entire surface of the resist.

12. A method according to claim 8, wherein the step of exposing the resist to assist in charged beam exposing comprises exposing a resist portion other than a portion where the rough pattern is to be formed.

13. A method according to claim 8, wherein the step of exposing the resist to assist in charged beam exposing comprises exposing a resist portion where the fine pattern is to be formed.

14. A pattern forming method comprising the steps of:
forming a pattern on a resist by charged beam exposing;
heating the resist after charged beam exposing;
developing the resist on which the pattern is formed; and
exposing the resist with a light beam before the developing step to assist in charged beam exposing.

15. A pattern forming method comprising:
the first step of forming a fine pattern on a resist by charged beam exposing;
the second step of heating the resist after the first step;
the third step of forming a rough pattern on the resist by light exposing after the second step;
the fourth step of heating the resist after the third step; and
the fifth step of developing the resist on which the rough pattern and the fine pattern are formed after the fourth step.

16. A method according to claim 15, wherein the resist is a chemically amplified resist having sensitivity for both an electron beam and a light beam.

17. A method according to claim 16, wherein, in the step of heating the resist after light exposing, a heating time is adjusted to a time required to substantially complete a crosslinking reaction or a decomposition reaction of a polymeric material due to an acid as a catalyst, the acid being generated in the resist upon light exposing.

18. A method according to claim 16, wherein, in the step of heating the resist after charged beam exposing, a heating time is adjusted to a time required to substantially complete a crosslinking reaction or a decomposition reaction of a polymeric material due to an acid as a catalyst, the acid being generated in the resist upon charged beam exposing.

19. A method according to claim 16, wherein a heating time when the resist is heated after light exposing is adjusted to be substantially the same as a heating time when the resist is heated after charged beam exposing.

* * * * *